(12) United States Patent
He

(10) Patent No.: US 11,223,894 B2
(45) Date of Patent: Jan. 11, 2022

(54) HORN FOR AN INTEGRATED FREQUENCY DIVISION CIRCUIT

(71) Applicant: ShenZhen YuanZe Electronics Co., Ltd, Shenzhen (CN)

(72) Inventor: Yue He, Guangdong (CN)

( * ) Notice: Subject to any disclaimer, the term of this patent is extended or adjusted under 35 U.S.C. 154(b) by 63 days.

(21) Appl. No.: 16/923,096

(22) Filed: Jul. 8, 2020

(65) Prior Publication Data
US 2021/0360343 A1 Nov. 18, 2021

(51) Int. Cl.
*H04R 1/10* (2006.01)
*H03F 3/217* (2006.01)

(52) U.S. Cl.
CPC ......... *H04R 1/1041* (2013.01); *H03F 3/2171* (2013.01); *H03F 2200/03* (2013.01); *H03F 2200/348* (2013.01)

(58) Field of Classification Search
CPC ............................ H04R 1/1041; H03F 3/2171
See application file for complete search history.

(56) References Cited

U.S. PATENT DOCUMENTS

| 7,583,112 | B2 | 9/2009 | Brekelmans |
| 7,804,932 | B2 | 9/2010 | Kravitz |
| 10,180,661 | B2 | 1/2019 | Sakumoto |
| 10,418,715 | B2 | 9/2019 | Tai |
| 2009/0102579 | A1* | 4/2009 | Rofougaran ........ H01L 25/0657 333/129 |

* cited by examiner

*Primary Examiner* — Simon King

(57) ABSTRACT

The invention relates to the technical field of earphone horn, more particular, relates to a horn of an integrated frequency division circuit, which includes a shell, a moving iron unit and a frequency division PCB connecting plate. The top surface of the frequency division PCB connecting plate is contacted with the bottom surface of the moving iron unit, and the side surface of the frequency division PCB connecting plate is connected with the inner edge of the bottom part of the shell; the frequency division PCB connecting plate is provided with an electronic frequency division circuit electrically connected with the moving iron unit. The horn of the integrated frequency division circuit integrates the electronic frequency division circuit, thus has the function of electronic frequency division, it reduces the production cost and the welding step, then enhances the production quality and the production efficiency.

10 Claims, 3 Drawing Sheets

HORN FOR AN INTEGRATED FREQUENCY DIVISION CIRCUIT

FIELD OF THE INVENTION

The invention relates to the technical field of earphone horns, more particularly relates to a horn with integrated frequency division circuit.

BACKGROUND OF THE INVENTION

Earphone speakers are generally divided into three categories, respectively, moving ring type earphone, moving iron type earphone and electrostatic headphone. Moving ring type earphone is the most mature one, the cost of good moving ring type earphone is expensive, the sound effect of the good moving ring type earphone is extremely outstanding. In professional applications, mobile ring headphones are basically used, Of course. because of technical questions, mobile ring headphone is also the cheapest one. Moving iron earphone is more special, simply said that the sound quality of moving iron type earphone is worse than that of good moving ring type earphone. Electrostatic headphones are the least used, its biggest feature is that the detail playback is very, very good, but the impedance is extremely high and it requires a large dedicated amplifier to work.

At present, earphone horns in use often need to have electronic frequency division function, so in the design of earphone, it needs to design independent circuit, or to achieve electronic frequency division function by welding independent frequency division board. However, the above two methods will increase the cost of design and welding, resulting in the reduction of production quality and production efficiency. Therefore, it is necessary to design a horn for integrated frequency division circuit.

SUMMARY OF THE INVENTION

The object of the invention is to provide an integrated frequency division circuit horn, which aims to solve the technical problem that the earphone horn in the prior art needs to connect the frequency division board separately when using the frequency division function, which will affect the production efficiency.

The technical proposal in the present invention are as followings:

The invention provides a horn of an integrated frequency division circuit, which includes a shell with inner edge, a moving iron unit arranged inside the shell and a frequency division PCB connecting plate with top surface and side surface, the top surface of the frequency division PCB connecting plate is contacted with the moving iron unit, and the side surface of the frequency division PCB connecting plate is connected with the inner edge of the shell; the frequency division PCB connecting plate is provided with an electronic frequency division circuit electrically connected with the moving iron unit.

Preferably, the electronic frequency division circuit includes a resistance R1 with a first end and a second end, a capacitance C1 with a first end and a second end, a positive electrode connection end, a negative electrode connection end, a horn input end and a moving iron connection end; the horn input end is electrically connected with the horn, and the moving iron connection end is electrically connected with the moving iron unit; the first end of the resistance R1 is connected with the positive electrode connection end and the horn input end, the second end of the resistance R1 is connected with the negative electrode connection end and the first end of the capacitance C1, the first end of the capacitance C1 is also connected with the moving iron connection end and the horn input end, and the second end of the capacitance C1 is connected with the moving iron connection end.

Preferably, the shell comprises a housing with top cover and side surface and a protective diaphragm with bottom surface, middle of the top cover of the housing is provided with a sound hole, the protective diaphragm is arranged inside the housing and blocks the sound hole, and the bottom surface of the protective diaphragm is fitted to the moving iron unit.

Preferably, the moving iron unit comprises a T iron, a ring magnet, a Hua Si and a sound coil, the T iron is attached to the frequency division PCB connecting plate, the ring magnet is sleeved with the T iron, the Hua Si is mounted on the ring magnet, the sound trap is sleeved with the T iron and is arranged in the ring magnet.

Preferably, the horn of an integrated frequency division circuit also comprises a coil lead welding plate, which is arranged at the side surface of the housing, and the coil lead welding plate is electrically connected with of the sound coil.

Preferably, the coil lead welding plate has an end face deviating from the shell, the end face is provided with a pad.

Preferably, the side surface of the housing is provided with a fixed part, and the coil lead welding plate is fixed to the fixed part.

Preferably, the fixing part comprises two fixing plates, and a distance between the two fixing plates is arranged to match a width of the coil lead welding plate so that the coil lead welding plate is arranged between the two fixing plates At least one or more of the above technical schemes in the horn of the integrated frequency division circuit provided by the embodiment in the invention have one of the following technical effects: in the present invention, an electronic frequency division circuit is arranged on the frequency division PCB connecting plate, and the electronic frequency division circuit is electrically connected with the moving iron unit, thus, the horn of the integrated frequency division circuit integrates an electronic frequency division circuit and have the function of electronic frequency division, when using, it no longer needs to weld the independent frequency division board, also does not need to design the electronic frequency division in the earphone, which reduces the production cost, and also reduces the welding steps, and then it improves production quality and efficiency.

BRIEF DESCRIPTION OF THE DRAWINGS

In order to illustrate more clearly the technical scheme in the embodiment of the present invention, the following is a brief introduction to the drawings that need to be used in the embodiment or the description of the prior art. Obviously, the drawings in the following description are only some embodiments of the present invention, and for the general technical personnel in the field, other drawings can be obtained on the basis of these drawings without giving creative labour.

EMBODIMENTS

Figure 1:
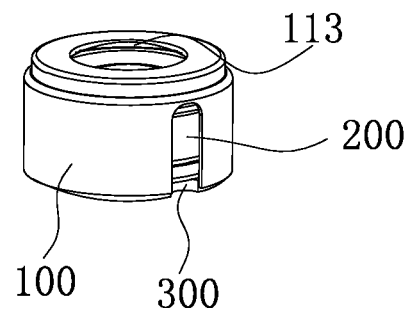
FIG. 1 is a schematic diagram of the horn of the integrated frequency division circuit according to the embodiment of the invention.
Figure 2:
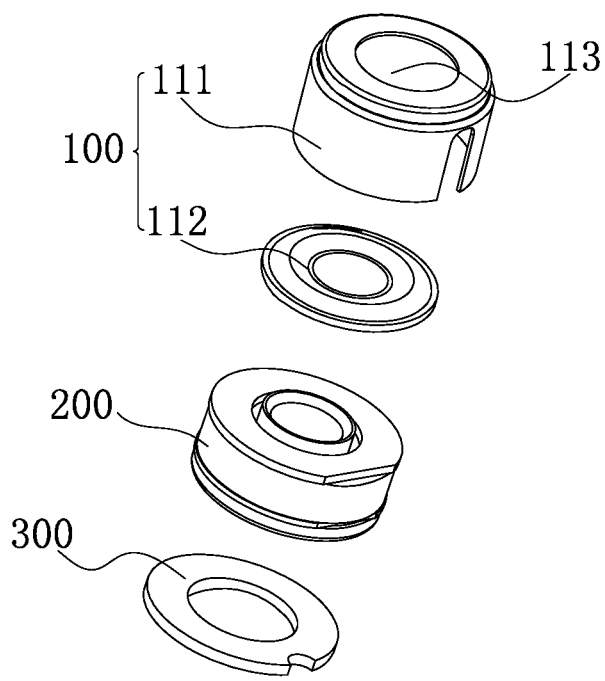
FIG. 2 is an explosive diagram of the horn of integrated frequency division circuit according to the embodiment of the invention.

Embodiments in the present invention are described detailedly in below, and an example of the embodiment is shown in the figure, where the same or similar labels from beginning to end indicates the same or similar element or a component with the same or similar function. The embodiments described below by reference to the figures are exemplary and are intended to be used to explain the embodiments of the invention and can not be understood as limitations to the invention.

In the description of the embodiment of the invention, it needs to be understood that the term "length", "width", "upper", "lower", "front", "rear", "left", "right", "vertical", "horizontal", "top", "bottom" inside", "outside", etc., is based on the azimuth or position relation shown in the drawings, it is used only to facilitate the description of the embodiment of the invention and to simplify the description, but not to indicate or imply that the device or element referred to must have a specific orientation, construct and operate with a specific orientation, and therefore it can not be understood as a limitation to the invention.

In addition, the terms "first", "second" are used only for descriptive purposes and they can not be understood as indicating or implying relative importance or implicitly indicating the number of technical features indicated. Thus, a feature that qualifies as "first" or "second" can explicitly or implicitly include one or more of the features. In the description of an embodiment of the present invention, the meaning of "multiple" is two or more, unless otherwise expressly and specifically qualified.

In embodiments of the present invention, unless otherwise specified and qualified, the terms "installation", "connection", "connection", "connection fixing", etc. shall be understood in a broad sense, for example, either a fixed connection, a detachable connection, or an integration; a mechanical connection, or an electrical connection; a direct connection, or indirect connection through an intermediate medium, or an internal connection of two elements or an interaction of two elements. For ordinary technicians in this field, the specific meaning of the above terms in the embodiment of the invention can be understood according to the specific circumstances.

In one embodiment of the invention, as shown in FIG. 1-FIG. 4, the horn of an integrated frequency division circuit includes a shell 100, a moving iron unit 200 arranged inside the shell 100 and a frequency division PCB connecting plate 300. The top surface of the frequency division PCB connecting plate 300 is contacted with the bottom surface of the moving iron unit 200, and the side surface of the frequency division PCB connecting plate 300 is connected with the inner edge of the bottom portion of the shell 100; the frequency division PCB connecting plate 300 is provided with an electronic frequency division circuit 400, which is electrically connected with the moving iron unit 200.

By setting the electronic frequency division circuit 400 on the frequency division PCB connecting board 300 and setting the electronic frequency division circuit 400 electrically connected with the moving iron unit 200, the horn of the integrated frequency division circuit in the invention integrates the electronic frequency division circuit 400 internally, thus having the function of electronic frequency division, it is no longer necessary to weld the independent frequency division board when using, at the same time, it is not necessary to carry out the electronic frequency division design in the earphone design, it reduces the production cost and reduces the welding steps, thereby improving the production quality and the production efficiency.

Figure 3:
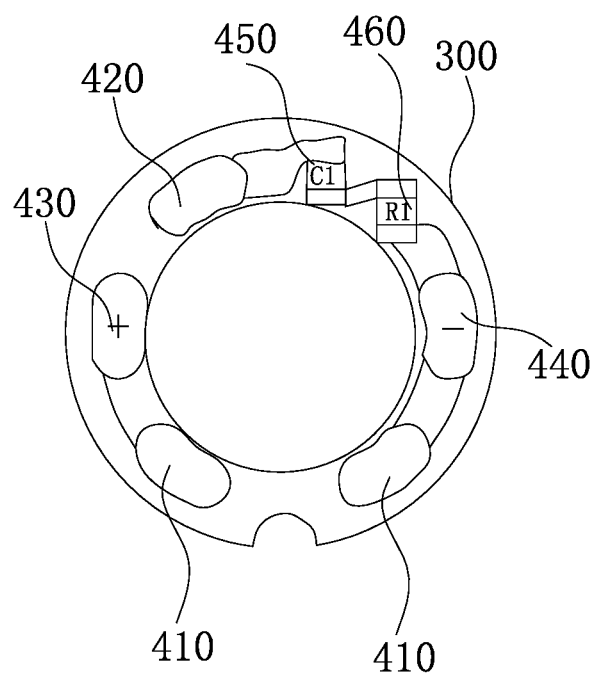
FIG. 3 is a distribution diagram of the coil lead welding plate of the frequency division PCB connecting plate of the horn of integrated frequency division circuit according to the embodiment of the invention.
Figure 4:
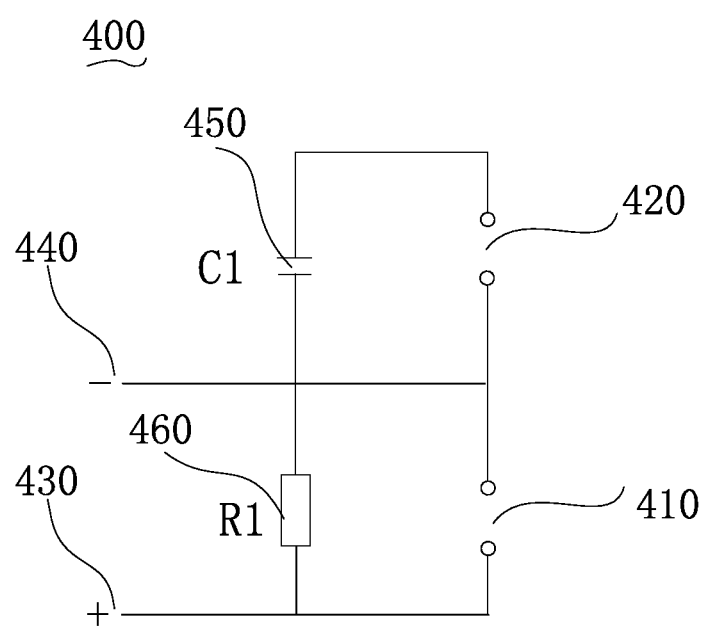
FIG. 4 is a schematic diagram of electronic frequency division circuit of the horn of integrated frequency division circuit according to the embodiment of the invention.
Figure 5:
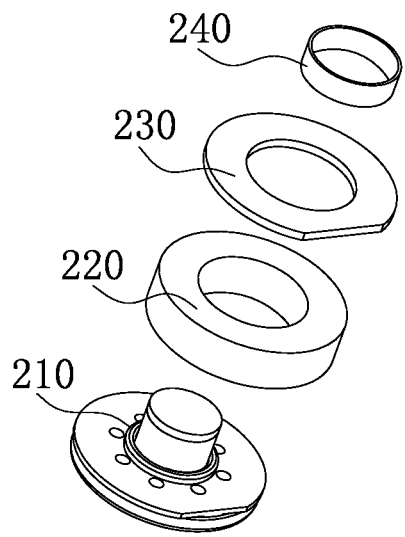
FIG. 5 is an explosive diagram of the moving iron unit of the horn of the integrated frequency division circuit provided for the embodiment of the invention.

In another embodiment in the invention, as shown in FIG. 3-FIG. 4, the electronic frequency division circuit 400 includes a resistance R1 450 with a first end and a second end, a capacitance C1 460 with a first end and a second end, a positive electrode connection end 430, a negative electrode connection end 440, a horn input end 410 and a moving iron connection end 420. The horn input end 410 is electrically connected with the horn, and the moving iron connection end 420 is electrically connected with the moving iron unit 200. The first end of the resistance R1 450 is connected with the positive electrode connection end 430 and the horn input end 410, the second end of the resistance R1 450 is connected with the negative electrode connection end 440 and the first end of the capacitance C1 460, the first end of the capacitance C1 460 is also connected with the moving iron connection end 420 and the horn input end 410, and the second end of the capacitance C1 460 is connected with the moving iron connection end 420. The positive connection end 430 and the negative connection end 440 refer to"+" and "−" in FIG. 3 and FIG. 4, respectively.

In particular, in practical use, the ordinary technicians in this field apply the electronic frequency division circuit 400 according to the hardware structure of the electronic frequency division circuit 400, based on the actual requirements, so as to realize the function of electronic frequency division. This application will not be repeated because the electronic frequency division circuit 400 should be known to the general technicians in this field according to the hardware circuit structure shown in this application.

In another embodiment of the invention, the shell 100 comprises a housing 111 and a protective vibration film 112, the middle part of the top cover of the housing 111 is provided with a sound hole 113, and the protective vibration film 112 is arranged inside the housing 111 and blocks the sound hole 113. In the present embodiment, the protective diaphragm 112 is used to prevent external material from interfering and to act as an isolation from the outside.

In another examples in the invention, referring to FIG. 1-FIG. 5, the moving iron unit 200 includes a T iron 210, a ring magnet 220, a Hua Si 230 and a sound ring 240. The bottom surface of the T iron 210 is fitted to the top surface of the frequency division PCB connecting plate 300, the ring magnet 220 is arranged on the T iron 210, the Hua Si 230 is mounted on the ring magnet 220, and the sound ring 240 is arranged on the T iron 210 and is arranged in the inner ring of the ring magnet 220. In particular, the sound coil 240 is electrically connected with the moving iron connection end 420.

Figure 6:
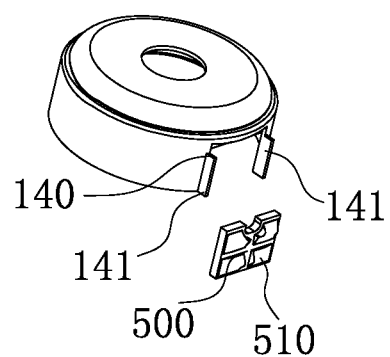
FIG. 6 is an schematic diagram of the shell and the coil lead welding plate of the horn of the integrated frequency division circuit according to another embodiment in the present invention.

In another embodiment of the invention, as shown in FIG. 6, the horn of the integrated frequency division circuit also includes a coil lead welding plate 500, which is arranged at the side end of the shell 100 and electrically connected with the coil 240.

By setting the coil lead welding plate 500 on the side of the shell 100, the internal components of the earphone horn are avoided from damaging when welding the coil lead of the coil 300, the devices of the coil horn are greatly protected, and the service life of the horn is indirectly improved, which has high practicability.

In particular, the sound coil lead welding plate 500 has a end face deviating from the shell 100 where a pad 510 is arranged, so when welding, the electric soldering iron contacts with the pad 510 far from the shell 100, so the high temperature brought by the electric soldering iron is isolated by the sound coil lead welding plate 500, thus playing the role of protecting the internal components of the earphone horn.

In another embodiment of the invention, the shell 100 is provided with a fixing portion 140 in its side surface, and the sound coil lead welding plate 500 is fixedly connected with the fixing portion 140. The fixing part 140 is used to facilitate fixing the coil lead welding plate 500.

In another embodiment of the invention, the fixing plates 141 includes two fixing parts 140, the distance between the two fixing plates 141 is arranged to match the width of the sound coil lead welding plate 500 so that the sound coil lead welding plate 500 is arranged between the two fixing plates 141. In the present embodiment, when welding the coil lead welding plate 500, it is only necessary to place the coil lead welding plate 500 between the two fixing plates 141 for welding, so the two fixing plates 141 also have a positioning function. The above is only a better embodiment of the invention and is not used to limit the invention. Any modification, equivalent replacement or improvement made within the spirit and principles of the invention shall be included within the scope of protection of the invention.

The invention claimed is:

1. A horn of an integrated frequency division circuit includes a shell with inner edge and a moving iron unit arranged inside said shell, wherein also comprising a frequency division PCB connecting plate with top surface and side surface, said top surface of said frequency division PCB connecting plate is contacted with said moving iron unit, and said side surface of said frequency division PCB connecting plate is connected with said inner edge of said shell; said frequency division PCB connecting plate is provided with an electronic frequency division circuit electrically connected with said moving iron unit.

2. The horn of said integrated frequency division circuit according to claim 1, wherein said electronic frequency division circuit includes a resistance R1 with a first end and a second end, a capacitance C1 with a first end and a second end, a positive electrode connection end, a negative electrode connection end, a horn input end and a moving iron connection end; said horn input end is electrically connected with said horn, and said moving iron connection end is electrically connected with said moving iron unit; said first end of said resistance R1 is connected with said positive electrode connection end and said horn input end, said second end of said resistance R1 is connected with said negative electrode connection end and said first end of said capacitance C1, said first end of said capacitance C1 is also connected with said moving iron connection end and said horn input end, and said second end of said capacitance C1 is connected with said moving iron connection end.

3. The horn of said integrated frequency division circuit according to claim 2, wherein said moving iron unit comprises a T iron, a ring magnet, a Hua Si and a sound coil, said T iron is attached to said frequency division PCB connecting plate, said ring magnet is sleeved with said T iron, said Hua Si is mounted on said ring magnet, said sound coil is sleeved with said T iron and is arranged in said ring magnet.

4. The horn of said integrated frequency division circuit according to claim 1, wherein said shell comprises a housing with top cover and side surface and a protective diaphragm with bottom surface, middle of said top cover of said housing is provided with a sound hole, said protective diaphragm is arranged inside said housing and blocks said sound hole, and said bottom surface of said protective diaphragm is fitted to said moving iron unit.

5. The horn of said integrated frequency division circuit according to claim 4, wherein said moving iron unit comprises a T iron, a ring magnet, a Hua Si and a sound coil, said T iron is attached to said frequency division PCB connecting plate, said ring magnet is sleeved with said T iron, said Hua Si is mounted on said ring magnet, said sound coil is sleeved with said T iron and is arranged in said ring magnet.

6. The horn of said integrated frequency division circuit according to claim 5, wherein said horn of said integrated frequency division circuit also comprises a coil lead welding plate, which is arranged at said side surface of said housing, and said coil lead welding plate is electrically connected with of said sound coil.

7. The horn of said integrated frequency division circuit according to claim 6, wherein said coil lead welding plate has an end face deviating from said shell, said end face is provided with a pad.

8. The horn of said integrated frequency division circuit according to claim 7, wherein said side surface of said housing is provided with a fixed part, and said coil lead welding plate is fixed to said fixed part.

9. The horn of said integrated frequency division circuit according to claim 8, wherein said fixing part comprises two fixing plates, and a distance between said two fixing plates is arranged to match width of said coil lead welding plate so that said coil lead welding plate is arranged between said two fixing plates.

10. The horn of said integrated frequency division circuit according to claim 1, wherein said moving iron unit comprises a T iron, a ring magnet, a Hua Si and a sound coil, said T iron is attached to said frequency division PCB connecting plate, said ring magnet is sleeved with said T iron, said Hua Si is mounted on said ring magnet, said sound coil is sleeved with said T iron and is arranged in said ring magnet.

* * * * *